(12) United States Patent
Aitken et al.

(10) Patent No.: US 8,435,605 B2
(45) Date of Patent: May 7, 2013

(54) FLEXIBLE SUBSTRATES HAVING A THIN-FILM BARRIER

(75) Inventors: Bruce Gardiner Aitken, Corning, NY (US); Dana Craig Bookbinder, Corning, NY (US); Sean Matthew Garner, Elmira, NY (US); Mark Alejandro Quesada, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/287,537

(22) Filed: Nov. 2, 2011

(65) Prior Publication Data

US 2012/0045567 A1 Feb. 23, 2012

Related U.S. Application Data

(62) Division of application No. 11/980,264, filed on Oct. 30, 2007, now Pat. No. 8,115,326.

(60) Provisional application No. 60/872,008, filed on Nov. 30, 2006.

(51) Int. Cl.
*B05D 3/02* (2006.01)
*H01L 23/29* (2006.01)
*B32B 1/04* (2006.01)

(52) U.S. Cl.
USPC ........ 427/376.1; 257/790; 257/701; 257/704; 428/76; 428/192

(58) Field of Classification Search ............... 427/376.1, 427/376.2; 428/76, 192; 257/788, 790, 701, 257/704
See application file for complete search history.

(56) References Cited

U.S. PATENT DOCUMENTS

| 3,622,439 | A | 11/1971 | Manne et al. ................ 161/184 |
| 3,916,048 | A | 10/1975 | Walles ............................ 428/35 |
| 3,932,693 | A | 1/1976 | Shaw et al. .................... 428/518 |
| 3,991,234 | A | 11/1976 | Chang et al. .................. 427/164 |
| 4,077,588 | A | 3/1978 | Hurst .............................. 244/31 |
| 4,314,031 | A | 2/1982 | Sanford et al. ................. 501/44 |
| 4,374,391 | A * | 2/1983 | Camlibel et al. ............. 257/634 |
| 4,702,963 | A | 10/1987 | Phillips et al. ................ 428/426 |

(Continued)

FOREIGN PATENT DOCUMENTS

| EP | 0 225 164 | 6/1987 | ......................... 27/34 |
| EP | 0 135 924 | 9/1987 | ........................... 27/8 |

(Continued)

OTHER PUBLICATIONS

Walther et al.; "Multilayer Barrier Coating System Produced by Plasma-Impulse Chemical Vapor Deposition (PICVD)"; Surface and Coatings Technology, vol. 80, pp. 200-202, 1996.

(Continued)

*Primary Examiner* — Michael Cleveland
*Assistant Examiner* — Tabatha Penny
(74) *Attorney, Agent, or Firm* — Kevin M. Able

(57) ABSTRACT

Methods and apparatus provide for: applying an inorganic barrier layer to at least a portion of a flexible substrate, the barrier layer being formed from a low liquidus temperature (LLT) material; and sintering the inorganic barrier layer while maintaining the flexible substrate below a critical temperature.

18 Claims, 6 Drawing Sheets

U.S. PATENT DOCUMENTS

| | | | |
|---|---|---|---|
| 4,740,412 A | 4/1988 | Hocker et al. | 428/194 |
| 4,802,742 A | 2/1989 | Ichikawa et al. | 350/339 |
| 4,859,513 A | 8/1989 | Gibbons et al. | 428/34.2 |
| 5,084,356 A | 1/1992 | Deak et al. | 428/458 |
| 5,089,446 A * | 2/1992 | Cornelius et al. | 501/15 |
| 5,110,637 A | 5/1992 | Ando et al. | 428/34 |
| 5,110,668 A | 5/1992 | Minnick | 428/215 |
| 5,183,684 A | 2/1993 | Carpenter | 427/574 |
| 5,211,995 A | 5/1993 | Kuehnle et al. | 427/570 |
| 5,324,572 A | 6/1994 | Kuechler et al. | 428/215 |
| 5,407,713 A | 4/1995 | Wilfong et al. | 428/34.1 |
| 5,462,779 A | 10/1995 | Misiano et al. | 428/34.7 |
| 5,478,618 A | 12/1995 | Rosen | 428/35.4 |
| 5,567,488 A | 10/1996 | Allen et al. | 428/34.1 |
| 5,610,742 A | 3/1997 | Hinata et al. | 349/122 |
| 5,641,559 A | 6/1997 | Namiki | 408/216 |
| 5,645,923 A | 7/1997 | Matsuo et al. | 428/216 |
| 5,736,207 A | 4/1998 | Walther et al. | 428/34.7 |
| 5,792,550 A | 8/1998 | Phillips et al. | 428/336 |
| 5,900,285 A | 5/1999 | Walther et al. | 427/491 |
| 6,083,313 A | 7/2000 | Venkatraman et al. | 106/287.14 |
| 6,162,892 A | 12/2000 | Kobayashi et al. | 528/310 |
| 6,171,663 B1 | 1/2001 | Hanada et al. | 428/1 |
| 6,171,703 B1 | 1/2001 | Haluska | 428/446 |
| 6,244,441 B1 | 6/2001 | Ahlgren | 206/522 |
| 6,268,695 B1 | 7/2001 | Affinito | 313/506 |
| 6,271,150 B1 | 8/2001 | Croswell et al. | 438/760 |
| 6,350,529 B1 | 2/2002 | Germain et al. | 428/476.3 |
| 6,403,176 B1 | 6/2002 | Patouraux et al. | 428/35.2 |
| 6,413,645 B1 | 7/2002 | Graff et al. | 428/446 |
| 6,426,311 B1 * | 7/2002 | Goto et al. | 501/4 |
| 6,465,101 B1 | 10/2002 | MacGregor et al. | 428/412 |
| 6,492,026 B1 | 12/2002 | Graff et al. | 428/411.1 |
| 6,522,067 B1 | 2/2003 | Graff et al. | 313/512 |
| 6,524,698 B1 | 2/2003 | Schmoock | 428/336 |
| 6,530,477 B1 | 3/2003 | Martorano et al. | 206/524.2 |
| 6,623,861 B2 | 9/2003 | Martin et al. | 428/412 |
| 6,720,097 B2 | 4/2004 | Ohkawa et al. | 428/701 |
| 6,740,394 B2 | 5/2004 | Jacobsen et al. | 428/216 |
| 6,873,101 B2 | 3/2005 | Nilsson et al. | 313/512 |
| 6,949,825 B1 * | 9/2005 | Guenther et al. | 257/725 |
| 7,208,238 B2 * | 4/2007 | Ikenishi et al. | 428/846.9 |
| 7,923,115 B2 | 4/2011 | Nagai et al. | 428/426 |
| 2001/0038894 A1 | 11/2001 | Komada | 428/34.6 |
| 2002/0037218 A1 | 3/2002 | Peiffer et al. | 428/458 |
| 2002/0110692 A1 | 8/2002 | Suzuki et al. | 428/411.1 |
| 2002/0114937 A1 | 8/2002 | Albert et al. | 428/304.4 |
| 2002/0142116 A1 | 10/2002 | Jud et al. | 428/35.3 |
| 2002/0180924 A1 | 12/2002 | Sobrinho | 349/158 |
| 2003/0000826 A1 | 1/2003 | Krempel-Hesse et al. | 204/173 |
| 2003/0017297 A1 * | 1/2003 | Song et al. | 428/68 |
| 2003/0044552 A1 | 3/2003 | Komada | 428/35.7 |
| 2003/0047353 A1 | 3/2003 | Yamaguchi et al. | 174/260 |
| 2003/0068534 A1 | 4/2003 | Ohkawa et al. | 428/701 |
| 2003/0085652 A1 | 5/2003 | Weaver | 313/506 |
| 2003/0098647 A1 * | 5/2003 | Silvernail et al. | 313/506 |
| 2003/0108664 A1 * | 6/2003 | Kodas et al. | 427/125 |
| 2003/0155151 A1 | 8/2003 | Hermanns et al. | 174/260 |
| 2003/0165696 A1 | 9/2003 | Namiki et al. | 428/446 |
| 2003/0183915 A1 | 10/2003 | Scheifers et al. | 257/682 |
| 2003/0184219 A1 | 10/2003 | Duggal et al. | 313/506 |
| 2003/0193286 A1 | 10/2003 | Ottermann et al. | 313/506 |
| 2003/0203210 A1 | 10/2003 | Graff et al. | 428/412 |
| 2003/0219632 A1 | 11/2003 | Schaepkens | 428/698 |
| 2004/0021820 A1 | 2/2004 | Sobrinho | 349/158 |
| 2004/0033379 A1 | 2/2004 | Grunlan et al. | 428/515 |
| 2004/0046497 A1 | 3/2004 | Schaepkens et al. | 313/506 |
| 2004/0174115 A1 | 9/2004 | Czeremuszkin et al. | 313/504 |
| 2004/0195960 A1 | 10/2004 | Czeremuszkin et al. | 313/504 |
| 2004/0197489 A1 | 10/2004 | Heuser et al. | 427/535 |
| 2004/0201027 A1 | 10/2004 | Ghosh | 257/99 |
| 2004/0209126 A1 | 10/2004 | Ziegler et al. | 428/702 |
| 2004/0229051 A1 | 11/2004 | Schaepkens et al. | 428/447 |
| 2004/0239241 A1 | 12/2004 | Wittmann et al. | 313/511 |
| 2004/0258893 A1 | 12/2004 | Penttinen et al. | 428/212 |
| 2005/0012448 A1 | 1/2005 | Ke et al. | 313/504 |
| 2005/0051763 A1 | 3/2005 | Affinito et al. | 257/3 |
| 2006/0132030 A1 * | 6/2006 | Gao et al. | 313/511 |
| 2007/0075301 A1 * | 4/2007 | Endo et al. | 252/514 |
| 2009/0079671 A1 * | 3/2009 | Nishi et al. | 345/55 |

FOREIGN PATENT DOCUMENTS

| | | | |
|---|---|---|---|
| EP | 0 151 462 | 8/1990 | 27/32 |
| EP | 0 288 972 | 9/1993 | 27/34 |
| EP | 0 394 519 | 2/1994 | 1/133 |
| EP | 0 588 667 | 3/1994 | 27/32 |
| EP | 0 494 594 | 10/1995 | 65/40 |
| EP | 0 705 757 | 4/1996 | 1/40 |
| EP | 0 744 285 | 12/1999 | 27/32 |
| EP | 0 701 897 | 4/2001 | 27/8 |
| EP | 1 118 459 | 7/2001 | 27/32 |
| EP | 0 895 013 | 8/2003 | 11/12 |
| EP | 0 977 469 | 9/2003 | 33/4 |
| EP | 1 420 041 | 5/2004 | 7/4 |
| EP | 1 443 067 | 8/2004 | 18/76 |
| EP | 0 787 824 | 9/2004 | 16/40 |
| EP | 1 640 154 | 3/2006 | 27/6 |
| EP | 1 410 902 | 4/2006 | 27/34 |
| EP | 1 892 775 | 2/2008 | 51/52 |
| WO | 93/22131 | 11/1993 | |
| WO | 97/22536 | 6/1997 | 65/40 |
| WO | 99/19229 | 4/1999 | 65/42 |
| WO | 00/66794 | 11/2000 | 7/20 |
| WO | 03/087247 | 10/2003 | 183/4 |
| WO | 2004/079781 | 9/2004 | |
| WO | 2004/105149 | 12/2004 | 51/10 |

OTHER PUBLICATIONS

Chatham; "Oxygen Diffusion Barrier Properties of Transparent Oxide Coatings on Polymeric Substrates", Surface and Coatings Technology, vol. 78, pp. 1-9, 1996.

* cited by examiner

FLEXIBLE SUBSTRATES HAVING A THIN-FILM BARRIER

CROSS REFERENCE TO RELATED APPLICATIONS

This is a divisional of U.S. patent application Ser. No. 11/980,264, filed on Oct. 30, 2007, now U.S. Pat. No. 8,115, 326, the content of which is relied upon and incorporated herein by reference in its entirety, and the benefit of priority under 35 U.S.C. §121 is hereby claimed, and which application claims the benefit of priority of U.S. Provisional Patent Application Ser. No. 60/872,008, filed Nov. 30, 2006, the disclosure of which application is incorporated herein by reference. This application is related to U.S. patent application Ser. No. 11/207,691, filed Aug. 18, 2005, the entire disclosure of which is hereby incorporated by reference.

BACKGROUND OF THE INVENTION

1. Field of the Invention

The present invention relates to methods and apparatus for inhibiting oxygen, moisture, and other gas or liquid penetration, and subsequent degradation of a device mounted on or protected by a flexible substrate. Examples of this device include a light-emitting device (e.g., organic light emitting diode (OLED) device), a display device, an electronic device (e.g., organic semiconducting devices), a photovoltaic device, a thin-film sensor, an evanescent waveguide sensor, a food container, a medicine container, etc.

2. Description of Related Art

Transport of oxygen or water through laminated or encapsulated materials and subsequent attack of an inner material(s) represent two of the more common degradation mechanisms associated with many devices, for example, light-emitting devices (OLED devices), thin-film sensors, and evanescent waveguide sensors. For a detailed discussion about the problems associated with oxygen and water penetration into the inner layers (cathode and electro-luminescent materials) of OLED and other devices, reference is made to the following documents: Aziz, H., Popovic, Z. D., Hu, N. X., Hor, A. H., and Xu, G. "Degradation Mechanism of Small Molecule-Based Organic Light-Emitting Devices", Science, 283, pp. 1900-1902, (1999); Burrows, P. E., Bulovic., V., Forrest, S. R., Sapochak, L. S., McCarty, D. M., Thompson, M. E. "Reliability and Degradation of Organic Light Emitting Devices", Applied Physics Letters, 65(23), pp. 2922-2924; and Chatham, H., "Review: Oxygen Diffusion Barrier Properties of Transparent Oxide Coatings on Polymeric Substrates", Surfaces and Coating Technology, 78, pp. 1-9, (1996).

Unless something is done to minimize the penetration of oxygen or water into OLED devices, the lifetimes would be severely affected. Much effort has been expended to drive OLED operation towards 40 kilo-hour lifetimes, the levels generally regarded as necessary so OLED devices can overtake older display technologies as discussed in the following document: Forsythe, Eric, W., "Operation of Organic-Based Light-Emitting Devices, in Society for Information Display (SID) 40$^{th}$ anniversary Seminar Lecture Notes, Vol. 1, Seminar M5, Hynes Convention Center, Boston, Mass., May 20 and 24, (2002).

The more prominent efforts to extend the lifetime of OLED devices include gettering, encapsulation and extensive device sealing techniques. Today one common way for sealing an OLED device is to use different types of epoxies, inorganic materials and/or organic materials that form a seal after they are cured by ultra-violet light, or heated by various means. For example, Vitex Systems, San Jose, Calif., www.vitexsys.com manufactures and offers for sale a coating under the brand name of BARIX which is a composite based approach where alternate layers of inorganic materials and organic materials are used to seal the entire surface of the OLED device. Although these types of seals provide some level of hermetic behavior, they can be very expensive and there are many instances in which they have failed to prevent the diffusion of oxygen and water into the OLED device under prolonged operation.

The same sort of oxygen and water penetration problem is common in other types of devices as well as, for example, thin-film sensors, evanescent waveguide sensors, food containers and medicine containers. Accordingly, there is a need to inhibit the penetration of oxygen and water into devices, for example, OLED devices, thin-film sensors, evanescent waveguide sensors, food containers and medicine containers. Besides oxygen and water, other gas or liquid materials passing through the substrate material is undesirable. For example; organic solvents contacting a fabricated OLED device can destroy performance, and maintaining the carbon dioxide content of food products may be desired. This need and other needs are satisfied by the present invention.

The problems associated with oxygen and water penetration can be exacerbated when the device(s) are mounted on or protected by a flexible substrate as the mechanism for providing a barrier to the oxygen and water must withstand the mechanical stresses associated with the use of a flexible substrate.

SUMMARY OF THE INVENTION

There has been a significant research investment in the development of a flexible display technology in recent years, as is described more fully in Crawford, Gregory P., Flexible Flat Panel Displays, Wiley Publishing Ltd (2005). To enable flexible display panels and specifically those based on OLED or organic electronics, prospective flexible display technologies require, at minimum, a hermetic barrier impermeable to oxygen and moisture as well as mechanical durability and process compatibility.

Some aspects of the invention relate to the field of flexible substrates and specifically to the application of flexible displays and flexible electronics. In these application areas, there are existing short term and long term needs for substrates that exhibit improvements in durability, thickness, weight, bend radius, and cost. There is a desire for flexible substrates having dimensional stability, matched CTE, toughness, transparency, thermal capability, and barrier properties and/or hermeticity suitable for active matrix display fabrication. Currently metal (e.g., stainless steel), thermoplastics (e.g., Polyethylene naphthalate (PEN), Polyethersulfone (PES), Polycarbonate (PC), Polyethylene terephthalate (PET), Polypropylene (PP), oriented polypropylene (OPP), etc.), and glass (e.g., borosilicate) substrates may be used for these applications.

In accordance with one or more embodiments of the invention, inorganic materials with improved hermeticity and mechanical durability are used as barrier layers for plastics, composites, or other higher temperature, flexible substrates.

Some embodiments of the present invention utilize an LLT (low liquidus temperature) material, which typically has a low liquidus temperature (or in specific embodiments a low glass transition temperature), to form a barrier layer on a flexible substrate. A device may then be disposed on the barrier layer. In some embodiments, the aforementioned barrier layer or an additional barrier layer may be disposed on the device. The LLT material includes, but is not limited to, tin fluorophosphate glass, chalcogenide glass, tellurite glass and borate glass. The LLT material can be deposited onto the flexible substrate by, for example, sputtering, co-evaporation, laser ablation, flash evaporation, spraying, pouring, frit-deposition, vapor-deposition, dip-coating, painting or rolling, spin-coating, or any combination thereof. Defects in the LLT material from the deposition step can be removed by a consolidation step (for example, heat treatment), to produce a pore-free, gas and moisture impenetrable protective coating on the flexible substrate. Although many of the deposition methods are possible with common glasses (i.e., those having high melting temperatures), the consolidation step is only practical with the LLT material where the consolidation temperature is sufficiently low so as to not damage the flexible substrate (and/or any inner layers in the device if disposed thereon). In other embodiments, the deposition step and/or heat treatment step take place in a vacuum, or in an inert atmosphere, or in ambient conditions depending upon the LLT's composition.

In accordance with one or more embodiments of the present invention, methods and apparatus provide for: applying an inorganic barrier layer to at least a portion of a flexible substrate; and sintering the inorganic barrier layer at a temperature lower than a critical temperature of the flexible substrate. Sintering may include consolidation, annealing, or other mechanisms that expose the barrier layer to thermal or other radiation and result in improved hermetic properties. The critical temperature may be at least one of: a softening temperature, a Tg temperature, temperature where about 10% weight loss occurs in the flexible substrate, and a thermal failure temperature of the flexible substrate. The temperature of the sintering step may be sufficient to reduce at least one of pinholes, inherent porosity, and defects in the barrier layer.

The step of sintering may include controlling at least one of: (i) a thickness of the inorganic barrier layer; and (ii) a modulus of the inorganic barrier layer. This may include increasing the modulus of the inorganic barrier layer by sintering to a consolidation temperature. Alternatively or additionally, the control may provide for sintering the inorganic barrier layer to form a modulus gradient such that the modulus at a first depth is different from the modulus at a second depth of the inorganic barrier layer.

In accordance with one or more embodiments of the present invention, methods and apparatus provide for: (a) computing stress in a barrier layer that has been disposed on a flexible substrate as a function of a modulus of the barrier layer, where the flexible substrate is of a given thickness, a given modulus, and a given radius of curvature; (b) computing the stress in the barrier layer as a function of a thickness of the barrier layer; (c) selecting a target stress for the barrier layer and determining a modulus and thickness for the barrier layer from the computation in (a)-(b); applying the barrier layer to at least a portion of the flexible substrate; and sintering the barrier layer at a temperature lower than a critical temperature of the flexible substrate to control the thickness and modulus of the barrier layer such that the target stress is not exceeded at the given radius of curvature.

In accordance with one or more embodiments of the present invention, methods and apparatus provide for: applying an inorganic barrier layer to at least a portion of a flexible substrate such that the inorganic barrier layer is patterned on the flexible substrate to create at least one region of the flexible substrate that is free of the inorganic barrier layer; and sintering the inorganic barrier layer at a temperature lower than a critical temperature of the flexible substrate. The methods may further provide for cutting through the flexible substrate at the at least one region of the flexible substrate. At least one region of the flexible substrate that is free of the inorganic barrier layer may be at one or more peripheral edges of the flexible substrate.

In accordance with one or more embodiments of the present invention, an apparatus may include: a flexible substrate; an inorganic barrier layer covering at least a portion of the flexible substrate, wherein at least one of: (i) the modulus of the barrier layer is one of about 30 GPa to about 120 GPa, about 30 GPa to about 80 GPa, and about 30 GPa to about 50 GPa; and (ii) the thickness of the barrier layer is one of less than about 10 um, less than about 5 um, and less than about 2 um.

The apparatus may further include: a device disposed on the barrier layer; and an encapsulation layer covering the device and terminating on the barrier layer, thereby forming an hermetic seal for the device. The device may be at least one of an electronic device, an optoelectronic device, an optical device, a light-emitting device, an OLED device, an organic semiconducting device, an LCD display device, a photovoltaic device, a thin-film sensor, an evanescent waveguide sensor, a food container, and a medicine container.

Other aspects, features, and advantages of the present invention will be apparent to one skilled in the art from the description herein taken in conjunction with the accompanying drawings.

BRIEF DESCRIPTION OF THE DRAWINGS

For the purposes of illustration, there are forms shown in the drawings that are presently preferred, it being understood, however, that the invention is not limited to the precise arrangements and instrumentalities shown. A more complete understanding of the present invention may be had by reference to the following detailed description when taken in conjunction with the accompanying drawings, wherein.

DETAILED DESCRIPTION OF THE INVENTION

Figure 1:
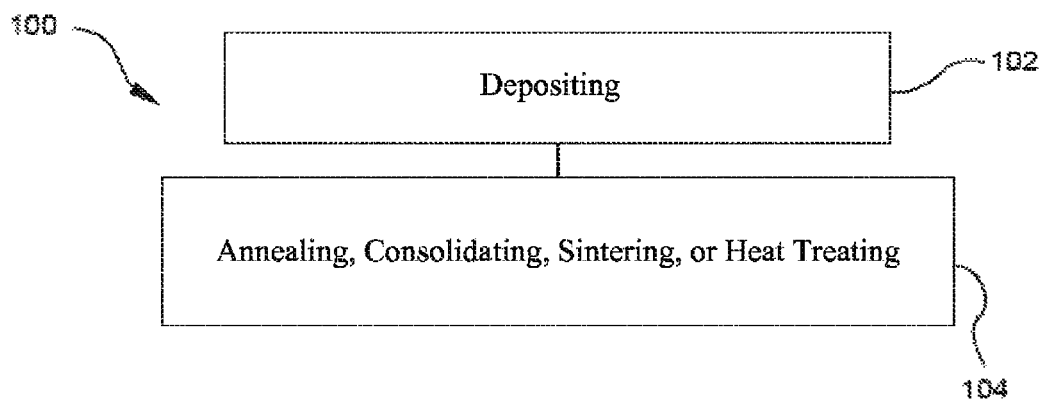
FIG. 1 is a flowchart illustrating the steps of a method for inhibiting oxygen and moisture degradation of a device in accordance with the present invention.
Figure 2:
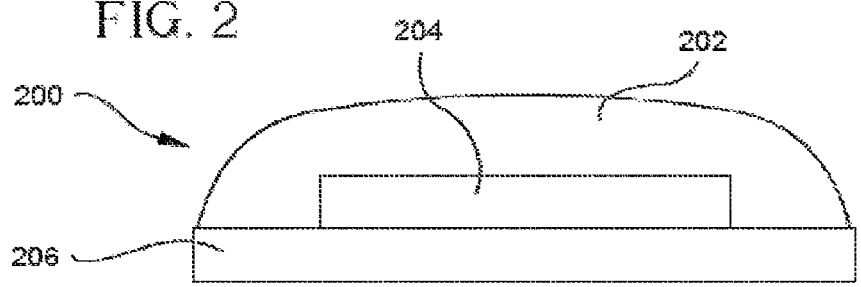
FIG. 2 is a cross-sectional side view of the device that is protected by LLT material applied by the method shown in FIG. 1 in accordance with the present invention.

In order to fully and clearly describe the details of the use of a barrier layer on a flexible substrate, a discussion of the deposition and processing of a low liquidus temperature material on one or more layers (such as device layers), all supported on a substrate is first discussed with reference to FIGS. 1-6. Referring to FIGS. 1-2, there are respectively illustrated a flowchart of a method 100 for inhibiting oxygen and moisture degradation of a device 200 and a cross-sectional side view of the protected device 200. As described below, the device 200 includes a heat treated low liquidus temperature (LLT) material 202, one or more inner layers 204 and a support 206.

The method 100 includes step 102 in which the LLT material 202 is deposited over one or more inner layers 204 located on top of the support 206 (e.g., substrate 206) (see also FIG. 5) of the device 200. The LLT material 202 can be deposited using any one of variety of processes including, for example, sputtering, flash evaporation, spraying, pouring, frit-deposition, vapor-deposition, dip-coating, painting, rolling (for example a film LLT material 202), spin-coating, a co-evaporation, a laser ablation process, or any combination thereof. These methods may also deposit other materials associated with the LLT material at the same time such as dispersants or particle surface coatings. Alternatively, more than one type of LLT material 202 can be deposited (e.g., sputtered) at the same time over one or more inner layers 204 located on top of the support 206 (e.g., substrate 206). Moreover, multiple layers of the same or different types of LLT material 202 can be deposited (e.g., sputtered) over one or more inner layers 204 located on top of the support 206 (e.g., substrate 206). The method 100 also includes step 104 in which the device 200 including the deposited LLT material 202 is annealed, consolidated, sintered, or heat treated. The heat treatment step may include exposure of the LLT material to thermal, microwave, optical, or other radiation or energy. The heat treatment step 104 is performed to remove defects (e.g., pores or other features that reduce barrier properties) within the LLT material 202 which were formed during the deposition step 102. The heat treatment is conducted at a temperature that does not damage inner layers located on the support (substrate) 206 of the device 200. Some examples of different devices 200 that can be protected by the heat treated LLT material 202 include a light-emitting device (e.g., OLED device), display devices (e.g., LCD displays), a photovoltaic device, a thin-film sensor, an evanescent waveguide sensor, a food container and a medicine container. The deposition step 102 and the heat treatment step 104 can be performed in a vacuum or inert atmosphere. This is done to ensure that the water-less and oxygen-free condition is maintained throughout the sealing process. This is especially important for robust, long-life operation of organic electronics with minimal degradation.

In one embodiment, the device 200 is an OLED device that has multiple inner layers 204 which include a cathode and electro-luminescent materials that are located on the substrate 206. The cathode and electro-luminescent materials 204 can be easily damaged if they are heated above, for example, 100-125° C. As such, the heat treatment step 104 (so as to minimize or eliminate porosity) would not be possible in this particular application if traditional glass was deposited on the OLED device 200. Because, the temperature (e.g., 600° C.) needed to remove the defects in a traditional glass (soda-lime) would be so high that the OLED device's inner layers 204 would be damaged. However, in the present invention, the heat treatment step 104 can be performed in this particular application because the temperature (e.g., 120° C.) needed to remove the defects in the LLT material 202 can be relatively low such that the OLED device's inner layers 204 would not be damaged. Likewise, the heat treatment step 104 occurs at a temperature low enough that no damage occurs to substrate 206 which may include polymeric or composite materials.

The use of LLT material 202 makes this all possible because this type of material has a relatively low liquidus temperature, e.g., ≦1000° C. The low liquidus temperature means that the LLT 202 can be heat treated at a relatively low temperature to obtain a pore-free film which will not thermally damage the OLED device's inner layer(s) 204 or substrate 206. Again, it should be appreciated that the heat treated LLT material 202 can also be used as a barrier layer on a wide variety of devices 200 in addition to the OLED device such as a thin-film sensor, display devices, an organic semiconductor device, a photovoltaic device, other electronic devices, an evanescent waveguide sensor, a food container, a medicine container or an electronic device that is sensitive to moisture, oxygen or other gases or liquids (for example).

In the preferred embodiment, the LLT material 202 has low liquidus temperature ≦1000° C. (and more preferably ≦600° C. and even more preferably ≦400° C.) and can include, for example, glass such as tin fluorophosphate glass, chalcogenide glass, tellurite glass, borosilicate glass, borate glass and phosphate glass (e.g., alkali Zn or SnZn pyrophosphates), materials containing both glass and crystalline components, as well as other materials responsive to an annealing treatment. These LLT materials 202 are desirable for several reasons including (for example):

- The low liquidus temperature (LLT) materials can be devoid of heavy metals and other environmentally undesirable materials.
- The LLT materials can be durable and exhibit low dissolution rates when immersed in water at 85° C. (<20 microns per day). See, Tick, P. A., "Water Durable Glasses with Ultra Low Melting Temperatures", Physics and Chemistry of Glasses, 25(6) pp. 149-154 (1984).
- The LLT material can contain dye molecules and can be doped to levels as high as 8 mM ($4.8 \times 10^{18}$ cm$^{-3}$). See, Tick, P. A., Hall, D. W., "Nonlinear Optical Effects in Organically Doped Low Melting Glasses", Diffusion and Defect Data, Vol. 53-54, pp. 179-188, (1987).
- The LLT phosphate glasses have helium permeability coefficients 4 to 5 orders of magnitude less than that of fused silica. See, Peter, K. H., Ho, D., Thomas, S., Friend, R. H., Tessler, N. "All-Polymer Optoelectronic Devices", Science, 285, pp. 233-236, (199).

The tin fluorophosphate glass 202 is discussed first and the preferred composition ranges of the various constituents (in parts by weight) are indicated in TABLE 1.

TABLE 1

| | tin fluorophosphate glass 202* |
|---|---|
| Sn | 20-85 wt % |
| P | 2-20 wt % |
| O | 10-36 wt % |
| F | 10-36 wt % |
| Nb | 0-5 wt % |

*at least 75% total of Sn + P + O + F.

For a detailed discussion about tin fluorophosphate glass 202, reference is made to the following documents: U.S. Pat. No. 4,314,031; U.S. Pat. No. 4,379,070; Tick, P. A., Weidman, D. L., "Optical Waveguides from Low Melting Temperature Glasses with Organic Dyes", in Proceedings of SPIE—The International Society for Optical Engineering—Nonlinear Optical Properties of Organic Materials V, pp. 391-401, (1993); Tick, P. A., "Water Durable Glasses with Ultra Low Melting Temperatures", Physics and Chemistry of Glasses, 25(6) pp. 149-154 (1984); Tick, P. A., Hall, D. W., "Nonlinear Optical Effects in Organically Doped Low Melting Glasses", Diffusion and Defect Data, Vol. 53-54, pp. 179-188, (1987), the entire disclosure of which are incorporated by reference herein.

Three different tin fluorophosphate glasses 202 (composition nos. 1-3), one tellurite glass 202 (composition no. 4) and one borate glass 202 (composition no. 5) have been tested. Details about these tested LLT glasses 202 and the results and conclusions from those experiments are described next. TABLES 2A and 2B illustrate the compositions of the tested exemplary LLT glasses 202 with their $T_G$ (in this example and other examples herein $T_G$ is related to the low liquidus temperature) and various constituents as follows:

TABLE 2A (atomic or element percent)

|  | tin fluoro-phosphate glass (Comp. #1) | tin fluorophosphate glass (Comp. #2) | tin fluorophosphate glass (Comp. #3) | tellurite glass (Comp. #4) | borate glass (Comp. #5) |
|---|---|---|---|---|---|
| Sn | 22.42 | 18.68 | 23.6 | — | — |
| P | 11.48 | 11.13 | 11.8 | — | — |
| O | 42.41 | 38.08 | 41.4 | 66.67 | 58.8 |
| Pb | — | 3.04 | — | — | — |
| F | 22.64 | 28.05 | 23.3 | — | — |
| Nb | 1.05 | 1.02 | — | — | — |
| Ta | — | — | — | 3.33 | — |
| Ga | — | — | — | 3.33 | — |
| Te | — | — | — | 26.67 | — |
| Bi | — | — | — | — | 25.9 |
| Zn | — | — | — | — | 5.88 |
| B | — | — | — | — | 9.41 |
| $T_G$ | 130° C. | 131° C. | 100° C. | 360° C. | 340° C. |

TABLE 2B (mole percent)

| Comp. #1 | 39.6 $SnF_2$ | 38.7 SnO | 19.9 $P_2O_5$ | 1.8 $Nb_2O_5$ |  |
|---|---|---|---|---|---|
| Comp. #2 | 39.5 $SnF_2$ | 27.7 SnO | 20.0 $P_2O_5$ | 1.8 $Nb_2O_5$ | 10.9 $PbF_2$ |
| Comp. #3 | 39.5 $SnF_2$ | 40.5 SnO | 20.0 $P_2O_5$ | — |  |
| Comp. #4 | 5.66 $Ta_2O_5$ | 5.66 $Ga_2O_3$ | 88.9 $TeO_2$ | — |  |
| Comp. #5 | 55 $Bi_2O_3$ | 25 ZnO | 20 $B_2O_3$ | — |  |

Figure 3:
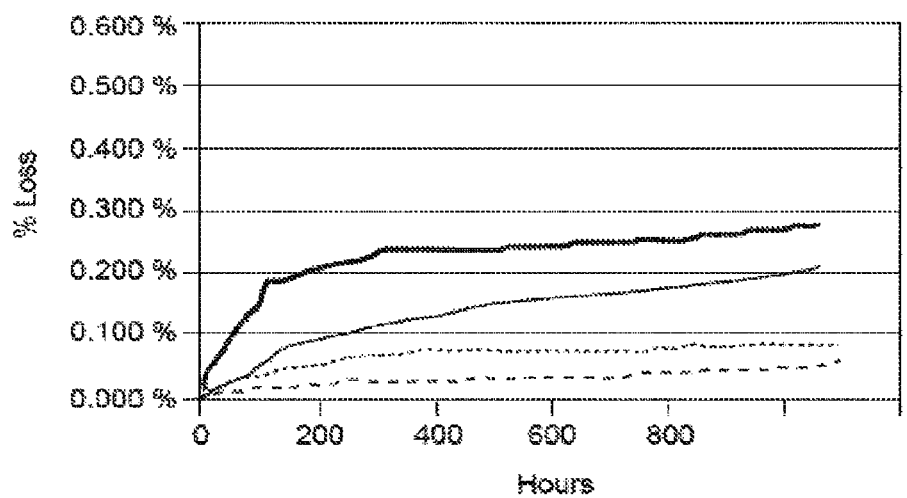
FIGS. 3-6 illustrate several different graphs, photos and diagrams that are used to help explain the different experiments and the results of the different experiments which were conducted to demonstrate the capabilities and advantages of the present invention.
Figure 4:
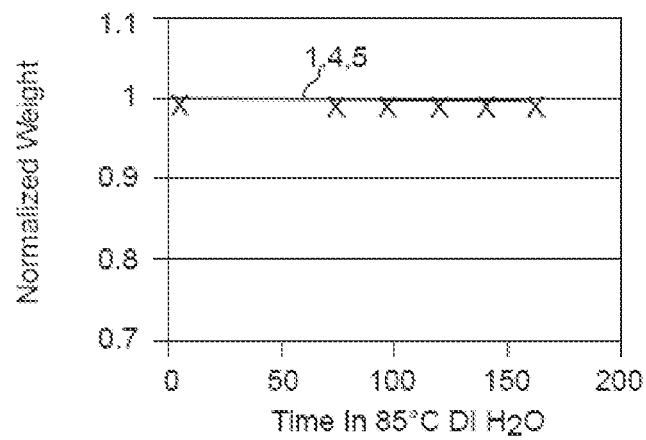

The tested LLT glasses 202 are durable as indicated in FIGS. 3 and 4. FIG. 3 is a graph that illustrates the results of a weight loss experiment that was conducted for 1000 hours in 85° C. DI water. As can be seen, the tested LLT glasses 202 (composition nos. 1, 2 and 4) have a durability that is comparable to Corning Incorporated code 1737 glass (traditional glass). In FIG. 3, the graph results for code 1737 glass, and composition numbers 1, 2, and 4 are indicated using reference numerals "1737", "1", "2", and "4", respectively. FIG. 4 is a graph that indicates the normalized weight loss measurements of the tested LLT glasses 202 (composition nos. 1 and 4-5). In FIG. 4, composition numbers 1, 4, and 5 are designated by reference numerals "1", "4", and "5", respectively.

Figure 5:
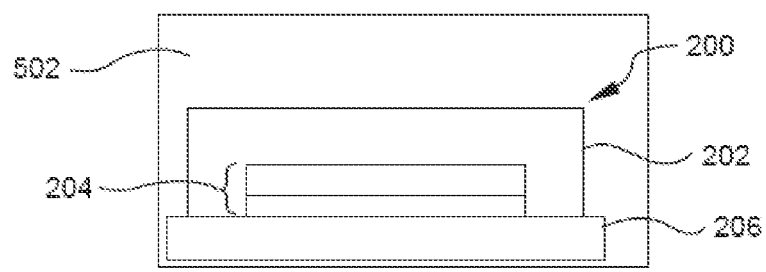

A "calcium patch" experiment was also performed and the resulting experimental data are discussed next to illustrate the low permeability of oxygen and water through one of the aforementioned LLT glass film layers 202 (composition no. 1). FIG. 5 is a cross-sectional side view of an oven 502 which contains a device 200 that includes LLT glass films 202 (composition no. 1), two inner layers 204 (Al and Ca) and a substrate 206 (Corning Incorporated code 1737 glass substrate). In the embodiment of FIG. 5, the inner layers 204 may include a 100 nm (nanometer) thick calcium layer and/or a 200 nm thick aluminum layer. The LLT glass layers 202 (which may be made of composition 1) may have a thickness equal to or greater than 1000 nm. The Al and Ca layers 204 were deposited on the thick substrate 206 and then encapsulated with LLT glass films 202 (composition no. 1). During this experiment, several of these devices 200 were placed within the oven 502 (which, when operated under the temperature and humidity conditions described herein, may be referred to as an "85/85 oven") and subjected to environmental aging at a fixed temperature and humidity, typically 85° C. and 85% relative humidity ("85/85 testing"). In each tested device 200, the Ca layer 204 was initially a highly reflecting metallic mirror. If water and oxygen penetrated the top encapsulation layer of LLT glass films 202, then the metallic Ca 204 reacted and turned into an opaque white flaky crust which could be quantified with an optical measurement (see FIG. 6).

More specifically, the "calcium patch" test was performed as follows. A 100 nm Ca film 204 was evaporated onto a Corning Incorporated code 1737 glass substrate 206. Then, a 200 nm Al layer 204 was evaporated on the Ca film 204. The Al layer 204 was used to simulate the conditions of a cathode typically used to produce polymer light emitting diodes (PLEDs). Using a "dual-boat" customized thermal evaporator (308R evaporator, Cressington Scientific Instruments Ltd., Watford, UK, www.cressington.com), the code 1737 glass substrate 206 was maintained at 130° C. and approximately $10^{-6}$ Torr during the Ca and Al evaporation steps. After cooling to room temperature, the vacuum was broken and then the calcium patch (substrate with deposited Ca and Al films) was extracted and carried in a vacuum dessicator to an RF sputtering vacuum system, and pumped overnight back to $10^{-6}$ Torr. The LLT glass 202 (composition no. 1) was then sputtered onto the Al and Ca layers 204 under relatively gentle RF power deposition conditions (30 W forward/1 W reflected RF power) and low argon pressure (~19 sccm)(see step 102 in FIG. 1). The sputtering was performed for 24 hours to obtain a glass thickness in the range of 2.5 μm (chamber pressure ~$10^{-3}$ Torr). It should be noted that the LLT material thickness can be made as thick as one needs depending on one's chosen deposition duration. Then, some of the newly created devices 200 were heated to ~121° C. by an infrared lamp which was mounted in the vacuum chamber to consolidate the sputtered LLT glass layers 202. Upon cooling, the vacuum was broken and the heat-treated devices 200 and the non-heat-treated devices 200 were placed in a humidity chamber and held at 85° C. and 85% relative humidity. During this period, pictures were taken at regular time intervals to quantify the evolution of the tested devices 200. A discussion of the changes to the calcium film in the tested devices 200, prepared under slightly different conditions, is provided below. Calcium oxidation may form on the upper surface, the left side, and/or right side surfaces of the LLT glass layers 202.

Photos (not shown) of several tested devices 200 were taken at regular intervals to follow the rate of calcium oxidation which is an indication of the permeation properties of the LTG glass films 202. A first set of images were taken of the devices 200 that show the initial metallic Ca layers 204 of tested devices 200 before oxidation reactions associated with this test occurred (i.e., $Ca+2H_2O \rightarrow Ca(OH)_2+H_2$, and $2Ca+O_2 \rightarrow 2CaO$). A second set of images were taken of a sample device 200 prepared without any heating of the LLT glass sputtered glass layer 202. A third set of images were taken of a similar device 200 that was heated (at 121° C.) during the first hour of the 24 hour glass deposition time interval (that is, at the start of the sputtering process). And, a fourth set of images were taken, of a tested device 200 that was heated for about one hour (at 121° C.) after the 24 hour glass deposition time interval. Based on the data shown in the graph of FIG. 6, the tested device 200 that had the entire LTG glass thickness subjected to heat-treatment (that is, the device 200 from which the fourth set of images were taken) fended off oxygen and water attack best. Thus, the heat treatment of physically deposited low-Tg glass significantly improved hermeticity.

Figure 6:
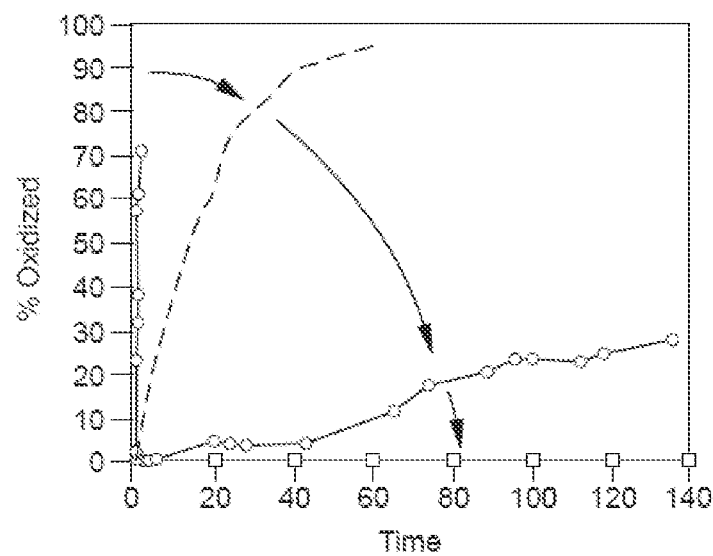

Selected characteristics of the images discussed above were quantified by calculating the percentage of the area of each device 200 that turned to a "white flaky crust" versus the percentage of area that maintained a "silvery metallic finish" and the calculated values were plotted as a function of time (see FIG. 6). FIG. 6 is a graph that illustrates the percentage of calcium area oxidized due to time (in hours) spent in the 85° C. and 85% relative humidity oven 502 for the three tested devices 200 (for which the second through fourth sets of images were taken, discussed above) and one non-covered device. As shown, data 702 represents the percentage of the calcium patch surface area that was oxidized on a calcium patch that had the 100 nm calcium and 200 nm aluminum layers but was not coated with LLT glass 202. Data 704 represents the calcium patch surface area that was oxidized in one of the tested devices 200 which had a 2.5 μm sputtered LLT glass layer 202 (composition no. 1) that was not heat treated. Data 704 were generated from the second set of images in the discussion above. Data 706 represents the calcium patch surface area that was oxidized in another tested device 200 which had a 2.5 μm sputtered LLT glass layer 202 (composition no. 1) that was heat treated at 121° C. for the first hour during the 24 hour deposition period. Data 706 were generated from the third set of images in the discussion above. Lastly, data 708 represents the calcium patch surface area that was oxidized in another test device 200 which had a 2.5 μm sputtered LLT glass layer 202 (composition no. 1) that was heat treated at 121° C. for one hour after the 24 hour deposition period. Data 708 were generated using the fourth set of images in the discussion above. As can be seen from data 708, the device 200 that was heat treated after the deposition period performed the best.

To generate the graph of FIG. 6, LabView™ (National Instruments Corp., Austin, Tex., www.ni.com) code was written to process sets two through four of the sets of images of the respective tested devices 200 taken while the devices were in the 85/85 oven 502. The first set of images, that were taken before the tested device 200 was placed in the humidity oven, served as the reference baseline from which a threshold was calculated. The threshold was assigned by choosing the first minimum pixel intensity value that occurred after the main peak, or "hump", in the histogram of the first set of images. Data pixels, in later images, were deemed "calcium oxidized" if their pixel value exceeded this threshold. The fraction of area, deemed "calcium oxidized" (that is, the percentage of the area of the devices 200 having $Ca(OH)_2$ coverage), at any given time in the oven 502, is plotted in FIG. 6. Clearly, the tested device 200 with the LLT glass 202 (composition no. 1) that was heat treated at 121° C. after the 24 hour film deposition step exhibited the best impermeability for moisture and oxygen (plot 708). As can be seen, this experiment has demonstrated that physically deposited low $T_G$ glass thin-film layers 202 can be gently "annealed" to restore the essentially pore-free barrier layer. Plot 708 illustrates oxidation data for a sputtered composition 1 material experiencing entire film consolidation. Plot 706 illustrates oxidation data for a sputtered composition 1 material experiencing partial film consolidation. And, plot 704 illustrates oxidation data for a sputtered composition 1 material experiencing no consolidation.

Next, we describe how the water permeation rates of the tested devices 200 were estimated with the aid of TABLE 3. The following discussion is directed to an embodiment of layer 204 that is made of calcium, having a thickness of 100 nm, a length of 2.54 centimeters (cm) (which equals one inch), and a width of 1.27 cm (which equals one half inch). The surface area of this layer is 3.2258 $cm^2$, or otherwise stated, $3.2258 \times 10^{-4}$ $m^2$. This calcium layer may also be described as having $\#Ca° \sim 7.51 \times 10^{17}$ atoms. This calcium layer may further be described as having $(\#Ca°/2)_{gm} \sim 2.51 \times 10^{-5}$ grams. The water permeation rate in the tested devices 200 were estimated by first calculating the total amount of calcium metal in the 100 nm layer 204. Then, by consulting FIG. 6 and other additional data, we estimated the time it took for half the calcium in the ½"×1"×100 nm patch to become oxidized, the so-called half life. This yields the average number of grams oxidized with water vapor per day, per unit $meter^2$ in an 85/85 environment. To convert to ambient conditions, a scale factor was introduced between the ambient time (ambient half life) and time spent in the 85/85 environment (85/85 half life). To determine this scale factor, we used a calcium patch made with calcium and aluminum layers alone and placed half in the 85/85 oven 502, and the other half was left out in atmosphere. The time (1.2 hours) it took the half of the calcium patch that was placed in the oven to oxidize versus the time (163 hours) it took the half left out in the atmosphere to oxidize enabled us to estimate the scale factor required to convert the measured permeation rates to ambient conditions. These values are shown in the underlined section in TABLE 3.

TABLE 3

|  | Half-life time to half coverage | 85/85 permeation rate (measured) | ambient permeation rate (calculated) |
|---|---|---|---|
| no glass cover | 163 hr | $1.1 \times 10^{-2}$ | $1.1 \times 10^{-2}$ |
| no glass cover* | 1.2 hr | 1.6 | $1.1 \times 10^{-2}$ |
| comp. no. 1 (no heating)* | 16 hr | $1.2 \times 10^{-1}$ | $\underline{8.6 \times 10^{-4}}$ |
| comp. no. 1 little heating* | ~320 hr | $5.8 \times 10^{-3}$ | $\underline{4.3 \times 10^{-5}}$ |
| comp. no. 1 more heating of structure* | ~1250 hr | $1.5 \times 10^{-3}$ | $\underline{1.1 \times 10^{-5}}$ |

*Heated in a "85/85" environment.

These values were compared with traditional seals like Vitex system's BARIX seals. This comparison indicates that the tested device 200 performed better than the device that used a BARIX seal. More specifically, a device 200 with LLT glass thereon, which was heated after the deposition step, experienced less oxidation (that is, less $Ca(OH)_2$ coverage) over time than the Vitex product did.

From the foregoing, it can be readily appreciated by those skilled in the art that the present invention utilizes LLT materials which have low liquidus temperatures to form a barrier layer with permeation properties comparable to the bulk material itself. The LLT materials include, but are not limited to, tin fluorophosphate glass, chalcogenide glass, borosilicate glass, tellurite glass, phosphate glass, and borate glass, materials containing both glass and crystalline components, as well as other materials responsive to an annealing treatment. These LLT materials are especially suitable for inhibiting oxygen or/and moisture degradation common to electronic devices, food or medicine. In addition, these LLT materials may be used to reduce, for example, photochemical, hydrolytic, and oxidative damage due to chemically active permeants. The LLT materials also act as a barrier to other gas or liquid materials that would otherwise propagate through the flexible substrate. The LLT materials may be deposited using one or more of the following methods such as sputtering, evaporation, spraying, pouring, frit-deposition, vapor-deposition, dip-coating, painting or rolling, spin-coating (for example). Defects in the LLT materials from the deposition step are removed by a consolidation step (heat treatment) in order to produce a pore-free, gas and liquid impenetrable protective coating on the device. The barrier layer is quite durable, exhibiting low weight loss (0.28%) in standardized 1000 hour, 85° C. water-immersion tests, and enduring over 600 hours in calcium patch tests, in 85° C. and 85% relative humidity chambers. Although many of the deposition methods are possible with common glasses (i.e. high melting temperature), the consolidation step is truly practical with the LLT materials where the consolidation temperature is sufficiently low to inhibit thermal damage to nearby layers.

In recent experiments that have been conducted, it has been shown that with a certain type of LLT material 202, namely the tin fluorophosphate material, higher Tg (and different stoichiometric composition) can be tolerated, after it has been deposited (sputtered) as a film and after that sputtered film has been heat-treated. While not wanting to be limited to a specific mechanism, a description is provided next to discuss a theory as to why the Tg (and stoichiometric composition) is different between the starting LLT material and both the sputtered (deposited) film and the heat-treated sputtered film. In this experiment it has been found the original composition no. 1 glass target has all divalent tin (i.e., $Sn^{2+}$); while, the sputter-deposited thin film material is composed of about 66% $Sn^{4+}$ and 34% $Sn^{2+}$. Now when this sputter-deposited thin film material is heated at 120° C. for one hour in vacuum, the tin oxidation state is driven to approximately 100% tetravalent tin (i.e., $Sn^{4+}$). It is believed that this difference in the Sn changes the stoichiometric composition and as a result the Tg of the deposited and heat treated composition no. 1 film.

It should be understood that this change in Tg appears to happen with the tin fluorophosphate material and not with the tellurite and borate films which have the same Tg as the starting targets. Moreover, a tin-pyrophosphate glass ($Sn_2P_2O_7$) was tested to see if the Tg changed between the evaporated (deposited) film and the heat-treated evaporated film. In this test, tin pyrophosphate powder was put into an evaporative heating boat in a vacuum chamber and pumped down to a $10^-6$ Torr vacuum. The boat was then heated with approximately 80 Watts electrical power before we started evaporating the material onto a substrate. The deposited material was then heated at 120° C. for one hour in vacuum. Then, a hermeticity experiment was conducted on the resulting film and it was found that the stoichiometric composition of the material was maintained through-out the entire process. This includes both the deposited film and the heated-deposited-film.

It has also been shown herein that barrier layers containing a subset of durable low liquidus temperature materials provide substantial protection from oxygen and water attack (and transport) beyond traditional physically-deposited oxide barrier layers. For instance, the preferred barrier layers described herein can have a water and oxygen permeance below $10^{-6}$ g/m²/day and $10^{-5}$ cc/m²/atm/day, respectively. Furthermore, it has been shown that physically-deposited low liquidus temperature thin-film barrier layers can be annealed at temperatures suitable for retaining the integrity of adjoining organic layer material physicochemical properties. This last feature makes durable low liquidus temperature materials unique compared with other physically deposited oxide barrier layers. These low liquidus temperature materials can be annealed at a low temperature so as to remove mesoscopic defects from the physically deposited layers and also retain the physicochemical properties of the adjoining organic under-layers. This is in contrast to the Vitex™ method in which the defects are not removed. Moreover, it has been shown that these low liquidus temperature barrier layers can be used to form an integral part of various devices (e.g., waveguide, grating sensors, photonic crystals etc.) while inhibiting the transport of materials detrimental to high-performance operation.

Even though specific types of tin fluorophosphate glass, borate glass and tellurite glass are discussed and described in detail herein, it should be appreciated that other types of LLT materials may also be used in accordance with the present invention. It should also be appreciated that low liquidus temperature materials can be made which contain small-composite materials or other electro-optic dopants. These dopants can optimize the refractive indices or add additional electro-optic features to a device 200. This can be particularly, useful when the device 200 is a waveguide sensor.

Figure 7:
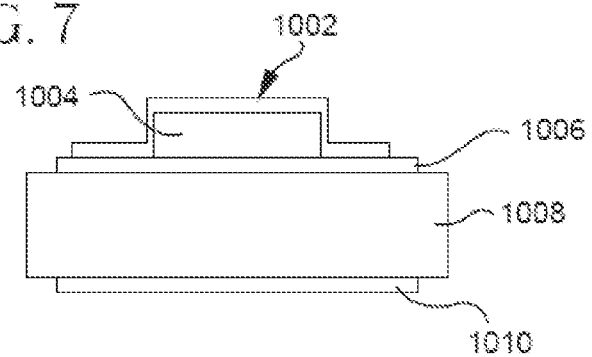
FIG. 7 is a cross-sectional view of a device that is hermetically sealed between a barrier layer and a flexible substrate layer.

Reference is now made to FIGS. 7-13, which depict details of one or more further embodiments of the present invention, particularly with regard to the deposition of a barrier layer on a flexible substrate. FIG. 7 illustrates a device that includes a device layer 1004, such as an electronic device, a display device, an optoelectronic device, etc., hermetically sealed between an encapsulant 1002 and a barrier layer 1006 (which may be formed from an inorganic material as is described in the remainder of this description). As noted previously, the device layer 1004 may actually consist of multiple layers. The encapsulant 1002 may be sintered LLT material, an inorganic barrier, and the like. Alternatively, the device layer 1004 may also be encapsulated on the top by an additional substrate 1008 and barrier layer 1006 thereby forming a symmetrical structure. The inorganic barrier layer 1006 covers at least a portion of a surface of a mechanically flexible or durable substrate 1008. By way of example, the flexible substrate 1008 may have the capability to bend to radii of less than about 20 cm, less than about 10 cm or less than about 1 cm.

Another inorganic barrier layer 1010 may cover another, opposing surface of the mechanically flexible or durable substrate 1008. The inorganic barrier layers 1006 and 1010 protect the substrate 1008 and the device 1004 from oxygen, moisture, or other gas or liquid components. It should be noted that the encapsulation 1002, barrier layer 1006, and barrier layer 1010 may consist of the same or different materials and may also consist of multiple layers. For simplicity, reference will be generally made to the barrier layer 1006, although the description thereof has equal applicability to the barrier layer 1010.

The embodiments of the invention illustrated in FIGS. 7-13 and described below also exploit the thin film nature of low melting glass (LMG) hermetic-sealing organic-electronic materials described above with respect to FIGS. 1-6 in the formation of the barrier coated flexible substrate 1008. In this situation, LMG refers to materials previously mentioned as LLT. The barrier 1006 is formed from a hermetic thin LMG film layer (transparent or otherwise) that is thin enough to form a flexible structure. For example the LMG thickness allows the film to bend without fracturing. It is noted that LMG may refer to inorganic materials that can be sintered or thermally treated at temperatures below the decomposition temperature of the supporting flexible substrate 1008. This enables the application of the inorganic barrier layer 1006 to the flexible substrate 1008 and then sintering to significantly improve the hermeticity. The flexible substrate 1008 may include materials such as polymer film or composites whose barrier properties can be improved with the application of a barrier layer 1006.

The basic process for forming the barrier layer 1006 onto the substrate includes the process techniques described with reference to FIGS. 1-2; however, additional description thereof is now provided. The barrier layer(s) 1006 is applied using, for example, sputtering, thermal evaporation, e-beam evaporation, other vacuum deposition methods, electrophoretic deposition, as well as non-vacuum deposition methods. With respect to sputtering or other methods, the composition of the deposition target may or may not be the same resulting material composition that ultimately gets deposited onto the substrate surface 1008. The thickness of the barrier layer may be from about 0.1 um or less to about 10 um, with desired ranges being less than about 10 um, less than about 5 um, or less than about 2 um. It is noted that greater or lesser thicknesses are also contemplated.

After applying the barrier layer(s) 1006, the hermetic properties are unlikely to meet the requirements for any practical applications, such as OLED, display applications, electronics applications, etc. To improve the barrier properties of the barrier layer 1006, a thermal treatment is performed to sinter/consolidate/anneal the applied barrier material 1006. Although a variety of methods are possible to apply the barrier layer 1006 to the substrate, proper consolidation requires a certain density to be present after the deposition process.

Although not necessarily required, the sintering temperature of the barrier layer 1006 would ideally be greater than any subsequent device fabrication temperatures and less than one or more thermal characteristics (e.g., critical thermal point) of the substrate 1008, such as the Tg, the softening point, a failure point, etc., of the substrate 1008 material. More specifically, the process of thermally treating the barrier layer 1006 would ideally not cause the substrate 1008 to reach one of these critical thermal points. In general, the properties of the barrier material will be bracketed by the capability of the substrate 1008 on one extreme and the requirements of the device fabrication process on the other. "Low Tg glass", "low liquidus temperature material", "low melting glass", or other terms used in reference to the barrier material are with respect to the substrate thermal characteristics. The barrier layer 1006 must be processed under conditions that do not destroy the substrate 1008 and yet be able to survive the processing conditions required to fabricate the device 1004.

In addition to the thermal considerations in sintering the barrier layer 1006 on the substrate 1008, other issues that should be considered to produce the apparatus 1000 include: thermal expansion differences, stresses in the applied barrier layer 1006 due to the deposition process, chemical compatibility of all materials and processes, adhesion between the barrier layer 1006 and substrate 1008, material mechanical properties of the substrate 1008 and the barrier layer 1006, substrate and barrier design, stresses that result due to the sintering/consolidation process, the surface quality of the substrate 1008, and other material compatibility or process related items.

Figure 8A:
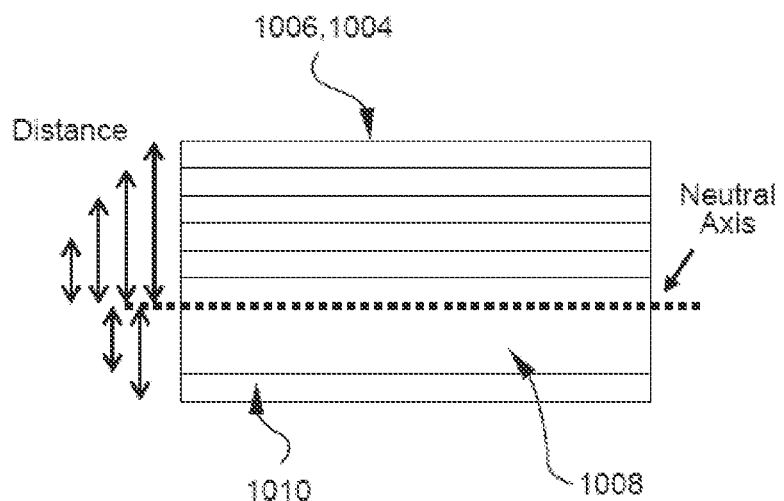
FIGS. 8-13 illustrate several different graphs, photos and diagrams that are used to help explain the different experiments and the results of the different experiments which were conducted to demonstrate the capabilities and advantages of the present invention.
Figure 8B:
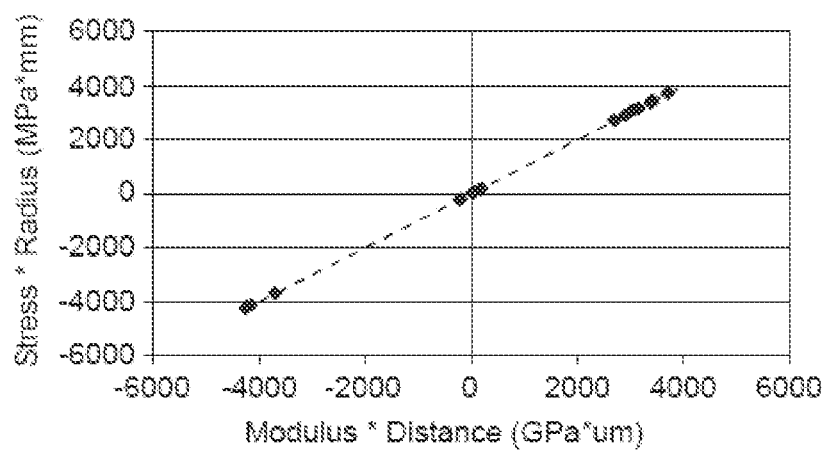

FIGS. 8A-B depict a model of a general design of the substrate 1008 and one or more barrier layers 1006 disposed thereon. The model may be used to calculate tensile stresses in multilayer structures in order to achieve design goals in the final apparatus 1000. Specifically, FIG. 8A illustrates the distance(s) between one or more barrier layers 1006 (and/or device layers 1004) and a neutral axis of the substrate 1008. FIG. 8B depicts the aforementioned affect of stress on the substrate 1008 and the barrier layer 1006. FIG. 8B shows a simplified calculated relationship between the resulting tensile or compressive stress in a given layer with respect to bend radius, the material modulus, and the distance from the structure neutral axis.

Some factors that significantly affect the bending stress in the barrier layer 1006 include the barrier layer modulus and the distance from the stress-free neutral axis to the barrier layer 1006. The thicknesses of the various layers in the substrate 1008 and barrier layer 1006 as well as the modulus values will affect the placement of the neutral axis. In general additional stresses due to thermal expansions, thin film depositions, annealing steps, etc. also need to be taken into account. It is noted that the stresses in a bent substrate-barrier product will be different before and after the device is fabricated on the barrier layer 1006. For example, bending a structure that consists of a substrate 1008 and a barrier layer 1006 will produce different stress levels than bending a structure that also includes device layer 1004. Thus, minimizing the stresses in the most fragile layers of the product requires careful substrate, device, encapsulant, and packaging design for a given application. As shown in FIG. 8B, the stress placed on the substrate and barrier layers during bending may be reduced by appropriate choices of material Young's modulus and distance from the neutral axis.

Figure 9A:
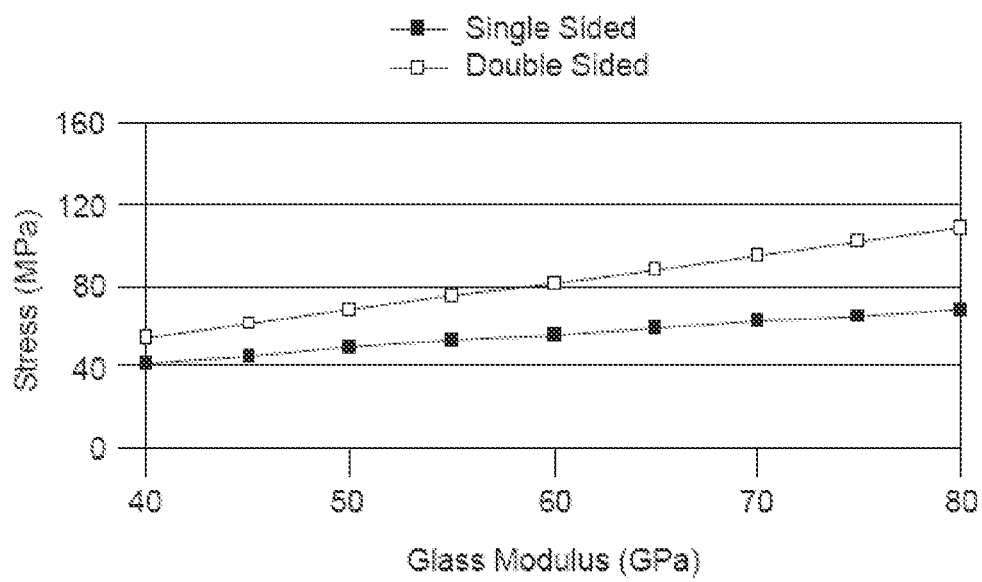
Figure 9B:
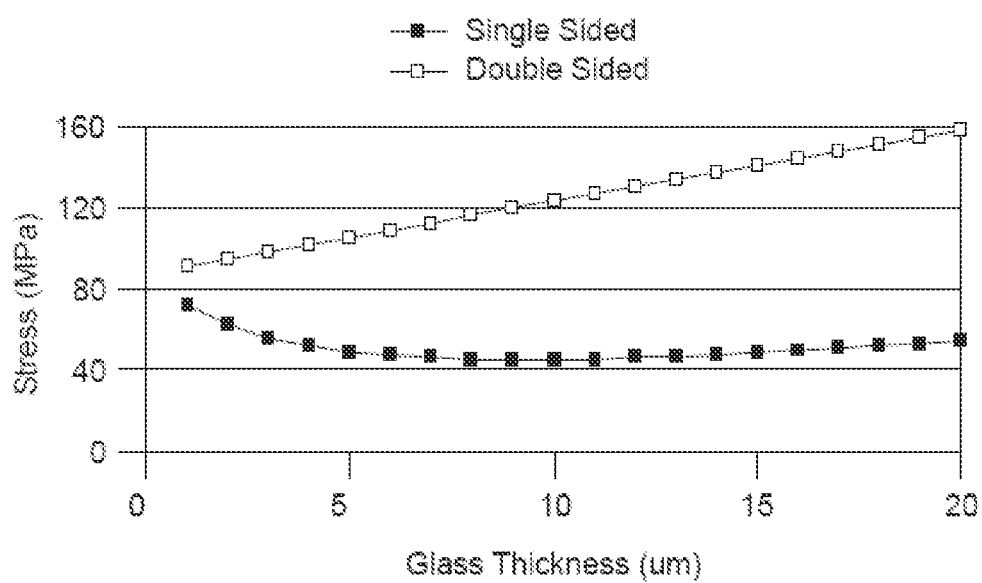

FIGS. 9A and 9B depict examples of the effects of the barrier layer 1006 modulus and thickness, respectively, on the tensile stress of the barrier layer 1006. Specifically, FIG. 9A includes graphs of stress 1204 (in MPa) as a function of Glass Modulus 1202 (in GPa) for both a single-sided 1206 barrier layer product and a double-sided 1208 barrier layer product. FIG. 9B includes graphs of stress 1204 (in MPa) as a function of glass thickness 1212 (in micrometers) for both a single-sided 1206 barrier layer product and a double-sided 1208 barrier layer product. The single-sided example refers to a barrier layer 1006 existing on the side of the substrate 1008 that experiences tensile stress. The double-sided example refers to a substrate 1008 that has both barrier layer 1006 and barrier layer 1010. The curves of FIGS. 9A and 9B will be different for different substrates 1008 and barrier layer 1006 and 1010 materials and thicknesses. In the illustrated embodiment, the curves represent the hypothetical characteristics of a polymer film substrate 1008 of 50 um thickness and 5 GPa modulus and a hypothetical barrier layer 1006 having a thickness of 2 um (variable) a modulus of 70 GPa (variable), both bent to a radius of 2 cm. For the curves representing double sided coatings, barrier layer 1010 has the same thickness and properties as barrier layer 1006.

Referring now to FIG. 9A, it is assumed that the thicknesses of the barrier layers 1006 and 1010 if present are held fixed at 2 um and their modulus 1202 is varied. As the moduli 1202 of the barrier layers 1006 and 1010 decrease, the tensile stress 1204 at the barrier layer 1006 also decreases. With reference to FIG. 9B, it is assumed that the moduli of the barrier layers 1006 and 1010 if present are fixed at 70 GPa and that their thicknesses 1212 are varied. As the thicknesses 1212 of the barrier layers 1006 and 1010 decrease, the tensile stress at the barrier layer 1006 also decreases. For a double sided coated substrate 1008, this decrease in tensile stress continuous monotonically. In the case of the single sided coated substrate 1008, however, there exists an optimum barrier layer 1006 thickness that results in the lowest tensile stress value. For the example shown in FIG. 9B, this optimum thickness occurs at a barrier layer 1006 thickness near 10 um. This optimum thickness, however, will depend highly on other stresses due to thermal effects, deposition processes, and other issues not taken into account here.

Using these curves, optimal (or at least desirable) characteristics of the barrier layer 1006, e.g., the thickness and modulus may be obtained. Thus, the curves of FIGS. 9A-9B may be employed to select a thickness and modulus for a given barrier layers 1006 and 1010 (if present) material on a given substrate 1008 of known thickness and modulus. More specifically, a target stress is determined and then FIGS. 9A-9B are consulted to determine the modulus and thickness of the barrier layer 1006 to achieve that stress. Again, depending on materials used and the properties of the substrate 1008, the thickness of the barrier layer 1006 may be less than about 10 um, less than about 5 um, or less than about 2 um. Desired modulus ranges for the barrier layer 1006 may be from about 30-120 GPa, about 30-80 GPa, or about 30-50 GPa.

TABLE 4 lists several materials that may be used to form the barrier layer and modulus, hardness and annealing temperatures for each. The modulus and hardness values were obtained by using a nano-indenter. Note that the annealing temperatures listed are defined in terms of bulk material viscosity and are not necessarily the same temperatures required to thermal treat deposited barrier layers.

TABLE 4 properties of barrier materials

| Material | Modulus (GPa) | Hardness (GPa) | Annealing Temperature (C.) |
|---|---|---|---|
| Corning Incorporated code 7070 glass | 49.2 | 6.5 | 496 |
| Composition 3 (Table 2A) | 33.8 | 1.9 | 100 |
| Composition 1 (Table 2A) | 39.6 | 2.3 | 130 |
| Composition 5 (Table 2A) | 73.9 | 4.9 (Vickers) | 400 |
| Composition 4 (Table 2A) | 55.7 | 4.0 | 350 |

Figure 10:
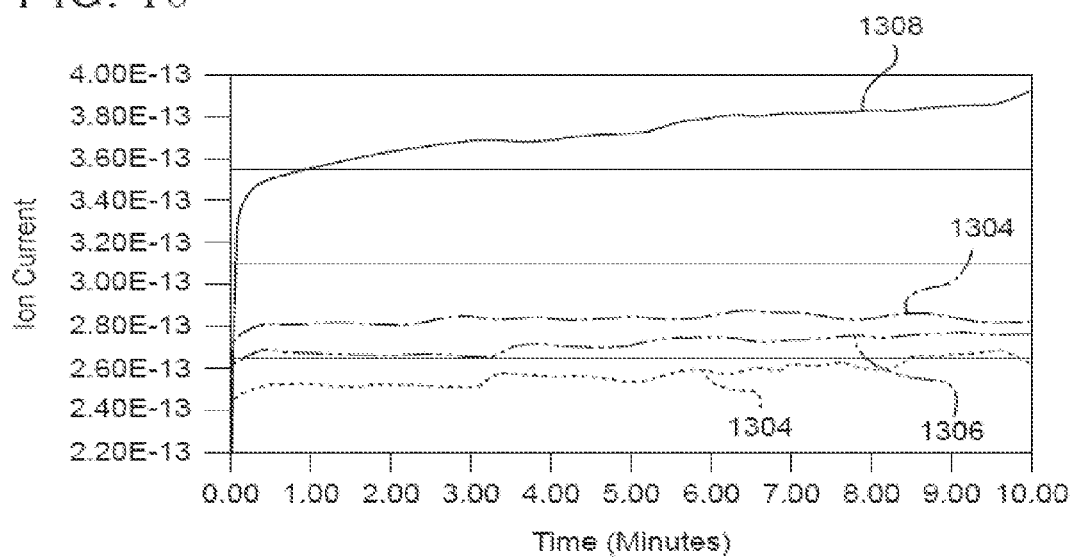

FIG. 10 is a graph 1300 that illustrates the hermetic properties of the substrate and several different materials from which the barrier layer 1006 may be formed. The diffusion of Helium (He) through the barrier layer 1006 and the substrate 1008 was measured over time. As a benchmark, the diffusion of He through 75 μm thick 0211 glass (curve 1302) was measured and compared to the diffusion of He through: (i) Composition 1 (Table 2A) deposited onto a first PEN (DuPont Teijin, Hopewell, Va., www.dupontteijinfilms.com, Teonex Q65A, 125 um) substrate (curve 1304) and a second PEN (repeat of previous trial) substrate (curve 1306) and (ii) silicone filled mica paper (US Samica, Rutland, Vt., www.ussamica.com, 4791 Micanite, 100 um) (curve 1308). As shown in FIG. 10, the Composition 1 (Table 2A) barrier layers (curves 1304 and 1306) demonstrated greater hermeticity than the silicone filled mica paper (curve 1308).

Examples of applied barrier layers 1006 include: Composition 1, bismuth zinc borate Composition 5 (Table 2A), Corning Incorporated code 7070 glass, tellurite glasses, and other compositions capable of being applied and thermally sintered at a temperature compatible with the substrate 1008. The composition of Corning Incorporated Code 7070 glass is about 72 parts $SiO_2$, about 1 part $Al_2O_3$, about 25 parts $B_2O_3$, about 0.5 parts $Li_2O$, about 0.5 parts $Na_2O$, and about 1 part $K_2O$. The substrate 1008 can be any flexible, durable material that would benefit from improved barrier properties. Examples of substrate materials include Kapton® polyimide (Dupont, www.dupont.com), PEN, silicone composites, and other flexible film materials.

Among the experimental data taken thus far, a 2.5 um thick layer of Composition 5 (Table 2A), the barrier layer 1006 was sputtered onto PEN (the substrate 1008) and thermally treated. This resulted in an improvement in the barrier properties of the substrate 1008. In another experiment, the affect of the annealing process on the barrier layer 1006 was tested by measuring the surface roughness, Ra, measured by Atomic Force Microscopy, (AFM) of Composition 1 (Table 2A) deposited onto a polished substrate: before sintering the Ra was 0.87 nm and after sintering the Ra was 0.17 nm.

In another example, Corning Incorporated code 7070 glass was sputtered onto a polished silicon wafer to a thickness of 0.430 um, with the process parameters including: RF power 300 W, Ar flow 25 sccm, pressure 4 mtorr, and deposition time 90 minutes. The resulting wafer was cleaved into several pieces, and each piece was sintered in a furnace at different temperatures (in air). The sintering temperatures included 100, 150, 200, 300, 400, 500, and 600 degrees C. (along with a room temperature baseline sample). The thermal profile included a 5 C/min ramp, a 1 hour hold, and an uncontrolled cooling to less than 90 degrees C. Visually, defects in the sputtered films were observed to be reduced starting at the 100 degree C. sintering. At the 300 degree C. sintering, defects present due to sputtering were not visually observed.

Figure 11A:
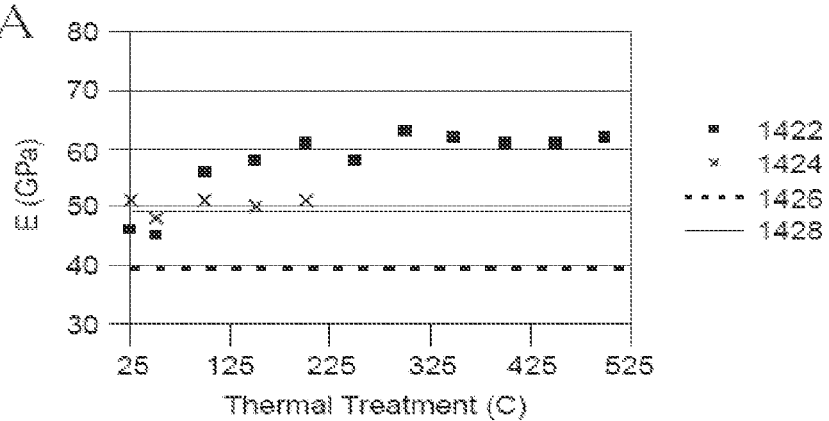
Figure 11B:
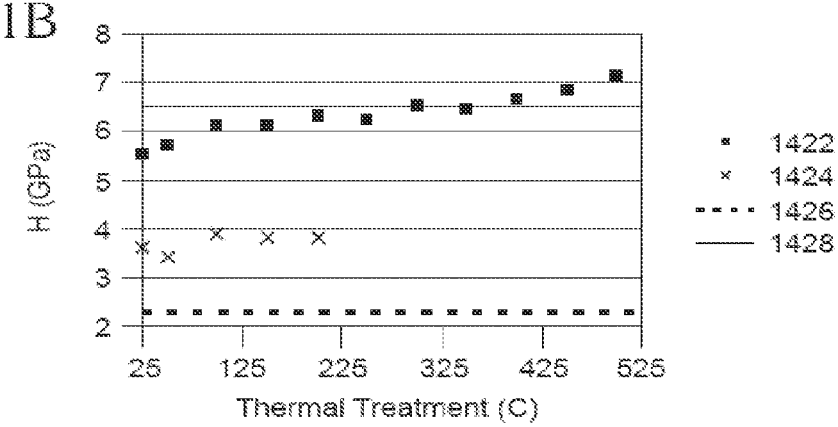

With reference to FIGS. 11A and 11B, the mechanical properties of the barrier layer 1006 can also be controlled through the sintering/consolidation or other subsequent processing steps. FIG. 11A includes graphs of the Youngs modulus (E) 1404 (in GPa) versus thermal treatment temperature 1402 (in degrees Celsius) for Corning code 7070 film 1422, composition 1 film 1424, composition 1 bulk material 1426, and Corning code 7070 bulk material 1428. FIG. 11B illustrates the hardness (H) 1414 (in GPa) versus thermal treatment temperature 1412 (in degrees Celsius), of Corning code 7070 film 1422, Composition 1 film 1424 (described in Table 2A), composition 1 bulk material 1426, and Corning code 7070 bulk material 1428. The composition 1 film 1424 and Corning Incorporated code 7070 film 1422 were sputtered onto silicon wafers and then sintered at varying temperatures. These values were obtained through nano-indentation techniques. The Corning Incorporated code 7070 film was sputtered using an RF power of W, an Ar flow of 19 sccm, a pressure of 2 mtorr, and a duration of 13 hours. The average Composition 1 (Table 2A) thickness was 1.5 um, and the average 7070 thickness was 0.4 um. Also noted on the graphs are the Young's modulus 1404 and hardness 1414 values for the Composition 1 bulk material 1426 (Table 2A) and the code 7070 bulk material 1428. It can be seen that the code 7070 modulus increases with temperature up until the possible consolidation temperature. The code 7070 hardness continued to increase.

The above curves (or similarly obtained curves using other materials and conditions) may be used to produce a modulus or hardness gradient in the barrier layer 1006 with an appropriate thermal treatment. For example, a degree of heat treatment/sintering may be varied through the thickness of the barrier layer 1006 to achieve the modulus gradient. Among the techniques that may be employed, laser sintering can be used to vary the sintering effect on the upper thickness of the barrier layer 1006 as opposed to the lower thickness thereof. As another technique described in reference to FIG. 6, the thermal treatment of the barrier layer 1006 may be varied during the deposition process. For example, different depths of the barrier layer 1006 may be thermally treated differently.

Alternatively, the modulus, hardness, or other mechanical properties can be optimized during the thermal treatment step. Further, the barrier layer 1006 is generally thicker prior to sintering. After sintering, the thickness of the barrier layer 1006 is reduced.

The barrier layers 1006 described above create a continuous layer on the substrate 1008, which may be susceptible to brittle fractures. Along with minimizing the stress levels in the layers, stress concentration points may also be minimized to achieve high quality hermetic products. Stress concentrations where fracture of the barrier layer 1006 can occur include edge defects and surface defects/roughness in the barrier layer 1006 or originating in the substrate 1008. Specifically, poor edge quality can limit the mechanical durability of the flexible product during use. Fractures in the barrier layer 1006 can propagate to the device 1004 or reduce the hermetic properties.

The edge quality of the brittle layer plays a significant role. Edge flaws concentrate the stress during flexing along such edge. This increased stress may cause the barrier layer 1006 to fracture across the entire width. To increase the substrate 1008 and device 1004 durability, the flaws along the edges of the barrier layer 1006 may be reduced.

Figure 12:
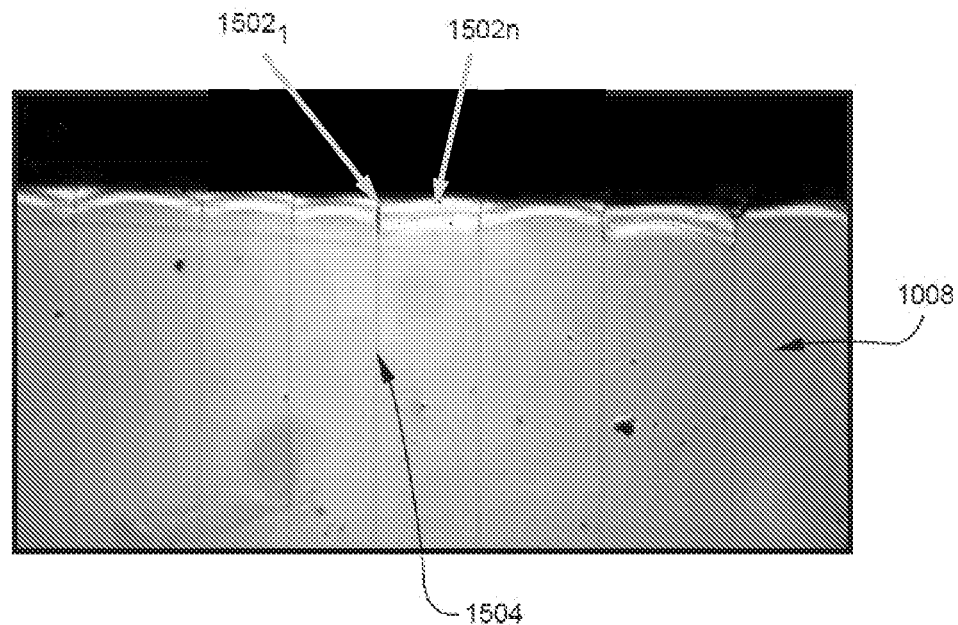

FIG. 12 is a top-view of a flexible substrate 1008, comprising a 1-2 um Composition 1 (Table 2A) glass layer sputtered onto a 125 um thick PEN substrate. The edge of the substrate 1008 is shown after bending, and cracks are seen propagating from the edge defects. Multiple edge defects, e.g. $1502_1$ to $1502_n$ (collectively 1502) and cracks, e.g., $1504_1$, originating from the edge defects 1502 and propagating across the substrate 1008 are visible.

Inefficient cutting methods may create substantial edge flaws in the barrier layer 1006. These flaws may propagate across the entire barrier layer 1006 width during bending. Even though the substrate 1008 may not shatter, because it is still held intact by the supporting polymeric substrate 1008 layer, the hermeticity and any device 1004 fabricated on its surface may be destroyed.

Figure 13A:
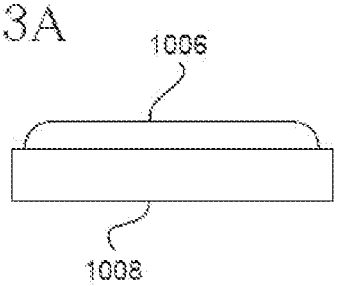
Figure 13B:
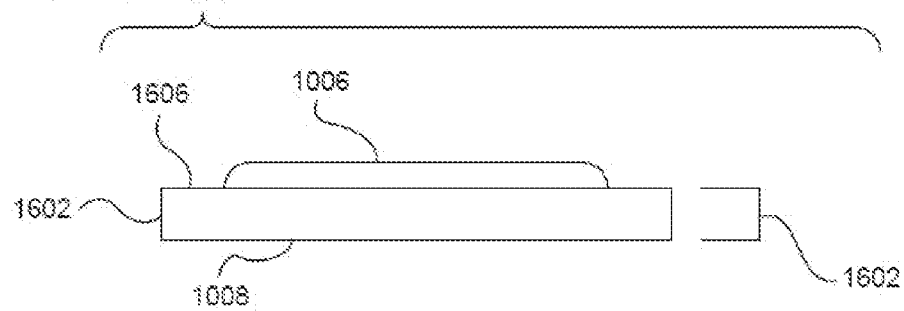

FIG. 13 illustrates a technique for creating a substrate 1008 having a high strength edge with reduced defects. FIG. 13A shows polymeric support (substrate) 1008 with a glass barrier (barrier layer) 1006 deposited thereon. The barrier layer 1006 has contoured (e.g., rounded) or otherwise low defect level edges that are formed through shadow masking (patterning), sintering, etching, or other methods that create low defect level edges in the barrier layer 1006. In the embodiment of FIG. 13B, barrier layer 1006 is deposited on only a portion or portions of the substrate 1008 to form runs 1606 on which no barrier layer 1006 exists. Further, the deposited barrier layer 1006 can also be formed away from an edge 1602 of the substrate 1008 such that the edge region of the substrate 1008 is totally devoid of any barrier layer 1006. The substrate 1008 may be cut through the runs 1606 without affecting edge quality or strength of the barrier layer 1006. These runs 1606 may form two-dimensional patterns on the substrate 1008 to produce areas in which individual devices 1004 may be separated from each other.

Among the aspects and advantages of the flexible substrate and barrier layer described above are:

Low manufacturing cost—The fabrication process for barrier coating flexible substrates may include a single deposition step followed by a thermal sintering. In comparison, alternative prior art multi-layer barrier techniques require several vacuum deposition steps each with their associated yield.

High thermal capability—The barrier layer composition can be tuned to fit the required device fabrication process and final application. This includes the ability to shift the thermal capability as needed. In comparison, alternative prior art multi-layer barrier approaches incorporate an organic layer that will limit their thermal capability.

Ability to control mechanical properties—The barrier layer composition and the process used to apply and sinter it can be modified to control the resulting mechanical properties. This is not easily achieved in alternative prior art barrier technologies. Additionally, one or more embodiments of the invention employ techniques to pattern the barrier layer to avoid cutting issues or other steps that would reduce the mechanical strength thereof. Overall, this allows control of the barrier layer 1006 mechanical properties in both the vertical and horizontal directions.

Eliminates edge seal issues—As shown in FIG. 7, the barrier layer 1006 deposited onto the flexible substrate 1008 is able to seal directly to the top encapsulating layer 1002. In alternative prior art multi-layer barrier technologies, however, the intermediate organic layers cause edge seal issues. Specifically, oxygen and moisture can propagate in these organic layers at the edge and reduce the device hermeticity.

Compatible with device processing—The composition of the barrier layer can also be modified to be compatible with the device chemical processing requirements. Specifically, the compatibility of the barrier layer 1006 to acids, bases, water, organic solvents, and other processing environments can be optimized as needed.

Improved barrier performance—The present invention creates an improved device barrier in a single layer. The composition selection allows sintering and consolidation at acceptable temperatures to significantly reduce (or eliminate) pinholes, inherent porosity, or other defects that would reduce the hermeticity. This technique is not possible with traditional $SiO_2$, $SiN_x$, or other deposited materials currently used for barrier layers.

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A method, comprising:
    applying an inorganic barrier layer to at least a portion of a flexible substrate, the barrier layer comprising at least one of a tin fluorophosphate material, a chalcogenide material, a phosphate material, a borate material, a bismuth zinc borate material, a glass, a borosilicate glass, a tellurite material, and a material including a composition of about 72 parts $SiO_2$, about 1 part $Al_2O_3$, about 25 parts $B_2O_3$, about 0.5 parts $Li_2O$, about 0.5 parts $Na_2O$, and about 1 part $K_2O$, wherein: (i) a modulus of the barrier layer is about 30 GPa to about 120 GPa; and (ii) a thickness of the barrier layer is less than about 10 μm; and
    sintering the inorganic barrier layer while maintaining the flexible substrate below a critical temperature thereof.

2. The method of claim 1, wherein a liquidus temperature of the barrier layer is below about 1000° C.

3. The method of claim 1, wherein a liquidus temperature of the barrier layer is below about 600° C.

4. The method of claim 1, wherein a liquidus temperature of the barrier layer is below about 400° C.

5. The method of claim 4, further comprising increasing the modulus of the inorganic barrier layer by sintering to a consolidation temperature.

6. The method of claim 1, wherein the critical temperature is at least one of: a softening temperature, a Tg temperature, and a temperature where about 10% weight loss occurs in the flexible substrate.

7. The method of claim 1, wherein the sintering step is such that at least one of pinholes, inherent porosity, and defects in the barrier layer are removed.

8. The method of claim 1, wherein the step of sintering includes controlling at least one of: (i) a surface roughness of the inorganic barrier layer; and (ii) a modulus of the inorganic barrier layer.

9. The method of claim 8, further comprising sintering the inorganic barrier layer to form a modulus gradient such that the modulus at a first depth is different from the modulus at a second depth of the inorganic barrier layer.

10. The method of claim 1, wherein the modulus of the inorganic barrier layer is about 30 GPa to about 80 GPa.

11. The method of claim 10, wherein the modulus of the inorganic barrier layer is about 30 GPa to about 50 GPa.

12. The method of claim 1, wherein the step of sintering is performed by exposing the barrier layer to thermal or electromagnetic energy sources.

13. The method of claim 12, wherein the electromagnetic energy source includes at least one of UV, visible, infrared, and microwave energy.

14. The method of claim 1, wherein the flexible substrate comprises at least one of a polyimide, polyethylene naphthalate (PEN), polyethylene terephthalate (PET), polycarbonate (PC), polypropylene (PP), oriented polypropylene (OPP), polyethersulfone (PES), silicone, an amorphous polymer film, a crystalline polymer film, and a silicone composite.

15. The method of claim 1, wherein the inorganic barrier layer comprises at least one of a tin fluorophosphate material, chalcogenide material, phosphate material, borate material, bismuth zinc borate material, glass, borosilicate glass, and a tellurite material.

16. The method of claim 1, wherein the step of applying includes utilizing a selected one or a combination of the following:
 a sputtering process;
 a thermal evaporation process;
 an e-beam evaporation process;
 a vacuum deposition process;
 a spraying process;
 a pouring process;
 a fit-deposition process;
 a vapor-deposition process;
 a dip-coating process;
 a painting process;
 a laser-ablation process;
 an electrophoretic deposition process;
 a co-evaporation process;
 a rolling process; and
 a spin-coating process.

17. A method, comprising:
 applying an inorganic barrier layer to at least a portion of a flexible substrate, the barrier layer comprising at least one of a tin fluorophosphate material, a chalcogenide material, a phosphate material, a borate material, a bismuth zinc borate material, a glass, a borosilicate glass, a tellurite material, and a material including a composition of about 72 parts $SiO_2$, about 1 part $Al_2O_3$, about 25 parts $B_2O_3$, about 0.5 parts $Li_2O$, about 0.5 parts $Na_2O$, and about 1 part $K_2O$, wherein at least one of: (i) a modulus of the barrier layer is about 30 GPa to about 120 GPa; and (ii) a thickness of the barrier layer is less than about 10 μm; and
 sintering the inorganic barrier layer while maintaining the flexible substrate below a critical temperature thereof and further comprising increasing the modulus of the inorganic barrier layer by sintering to a consolidation temperature, wherein a liquidus temperature of the barrier layer is below about 400° C.

18. A method, comprising:
 applying an inorganic barrier layer to at least a portion of a flexible substrate, the barrier layer comprising at least one of a tin fluorophosphate material, a chalcogenide material, a phosphate material, a borate material, a bismuth zinc borate material, a glass, a borosilicate glass, a tellurite material, and a material including a composition of about 72 parts $SiO_2$, about 1 part $Al_2O_3$, about 25 parts $B_2O_3$, about 0.5 parts $Li_2O$, about 0.5 parts $Na_2O$, and about 1 part $K_2O$, wherein at least one of: (i) a modulus of the barrier layer is about 30 GPa to about 120 GPa; and (ii) a thickness of the barrier layer is less than about 10 μm; and
 sintering the inorganic barrier layer while maintaining the flexible substrate below a critical temperature thereof; wherein the step of sintering includes controlling at least one of: (i) a surface roughness of the inorganic barrier layer; and (ii) a modulus of the inorganic barrier layer; and further comprising sintering the inorganic barrier layer to form a modulus gradient such that the modulus at a first depth is different from the modulus at a second depth of the inorganic barrier layer.

\* \* \* \* \*